(12) United States Patent
Kashem et al.

(10) Patent No.: US 11,875,875 B2
(45) Date of Patent: Jan. 16, 2024

(54) VARIABLE TICK FOR DRAM INTERFACE CALIBRATION

(71) Applicant: Advanced Micro Devices, Inc., Santa Clara, CA (US)

(72) Inventors: Anwar Kashem, Boxborough, MA (US); Craig Daniel Eaton, Austin, TX (US); Pouya Najafi Ashtiani, Munich (DE)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/564,426

(22) Filed: Dec. 29, 2021

(65) Prior Publication Data

US 2023/0206973 A1 Jun. 29, 2023

(51) Int. Cl.
*G11C 7/22* (2006.01)
*G11C 7/10* (2006.01)
*G11C 5/06* (2006.01)

(52) U.S. Cl.
CPC ............ *G11C 7/222* (2013.01); *G11C 5/06* (2013.01); *G11C 7/1063* (2013.01); *G11C 7/1066* (2013.01); *G11C 7/1093* (2013.01)

(58) Field of Classification Search
CPC .................. G11C 7/222; G11C 7/22

USPC ........................................................ 365/233.1
See application file for complete search history.

(56) References Cited

U.S. PATENT DOCUMENTS

| | | |
|---|---|---|
| 2004/0187046 A1 | 9/2004 | Lee et al. |
| 2010/0220536 A1 | 9/2010 | Coteus et al. |
| 2012/0079160 A1 | 3/2012 | Iyer et al. |
| 2014/0003182 A1 | 1/2014 | Quach et al. |
| 2015/0221350 A1* | 8/2015 | Rao ...................... G11C 7/1093 365/230.03 |
| 2019/0027208 A1 | 1/2019 | Gans et al. |
| 2021/0193198 A1* | 6/2021 | Johnson ............... G11C 29/028 |
| 2021/0312972 A1* | 10/2021 | Kumar .................... G11C 7/222 |
| 2021/0349730 A1* | 11/2021 | Lee ........................ G11C 29/022 |
| 2022/0244890 A1* | 8/2022 | Bloemer ............. G11C 11/4072 |

* cited by examiner

*Primary Examiner* — Muna A Techane
(74) *Attorney, Agent, or Firm* — Volpe Koenig (57) ABSTRACT

Methods and systems are disclosed for calibrating, by a memory interface system, an interface with dynamic random-access memory (DRAM) using a dynamically changing training clock. Techniques disclosed comprise receiving a system clock having a clock signal at a first pulse rate. Then, during the training of the interface, techniques disclosed comprise generating a training clock from the clock signal at the first pulse rate, the training clock having a clock signal at a second pulse rate, and sending, based on the generated training clock, command signals, including address data, to the DRAM.

20 Claims, 6 Drawing Sheets

VARIABLE TICK FOR DRAM INTERFACE CALIBRATION

CROSS REFERENCE TO RELATED APPLICATION

U.S. patent application Ser. No. 17/564,327, filed Dec. 29, 2021, titled "DRAM specific interface calibration via programmable training sequences," is hereby incorporated by reference herein by its entirety.

BACKGROUND

Processing units rely on memory devices to store data and instructions used during operations. Access to memory devices, for example dynamic random-access memory (DRAM), is controlled by a memory physical layer, namely a memory interface (or PHY). Due to variations in the computing environments and in the manufacturing (associated with a DRAM, the processing unit that accesses the DRAM, and the communication link between them), operational parameters that control circuitry in datapaths to and from the DRAM need to be periodically calibrated. Such calibration is performed through training of the memory interface to the DRAM. Often, calibration needs to be performed during operation in different clock frequencies, and so techniques that allow seamless transitions from one clock pulse rate or frequency to another are needed.

BRIEF DESCRIPTION OF THE DRAWINGS

A more detailed understanding may be had from the following description, given by way of example in conjunction with the accompanying drawings wherein.

DETAILED DESCRIPTION

Systems and methods are provided for programable and accelerated training of datapaths residing in a memory interface system and DRAM connected thereto. Systems include a sequencer that orchestrates the training operation, implemented in programable firmware. The sequencer is configured to schedule DRAM commands (i.e., commands) inline with other system commands. The commands are sent to the DRAM, via the system datapath, at a rate that can be dynamically altered during the training operation to match a training frequency at which the DRAM is to be calibrated. When training the address channels, the training frequency can be dynamically reduced to accommodate uncertainties in the delays that are introduced by signal propagation times along wires that feed address data to the address pins of the DRAM. As disclosed herein, the system can independently control the training clock and the rate of the DRAM commands.

Aspects disclosed in the present disclosure describe methods for calibrating, by a memory interface system, an interface with DRAM using a dynamically changing training clock. The methods comprise receiving a system clock having a clock signal at a first pulse rate. Then, during the training of the interface, the methods further comprise generating a training clock from the clock signal at the first pulse rate, the training clock having a clock signal at a second pulse rate, and sending, based on the generated training clock, command signals, including address data, to the DRAM.

Aspects disclosed in the present disclosure also describe memory interface systems for calibrating an interface with DRAM, using a dynamically changing training clock. The systems comprise at least one processor and memory storing instructions. The instructions, when executed by the at least one processor, cause the processor to receive a system clock having a clock signal at a first pulse rate. Then, during the training of the interface, the instructions further cause the processor to generate a training clock from the clock signal at the first pulse rate, the training clock having a clock signal at a second pulse rate, and to send, based on the generated training clock, command signals, including address data, to the DRAM.

Further, aspects disclosed in the present disclosure describe a non-transitory computer-readable medium comprising instructions executable by at least one processor to perform methods for calibrating an interface with DRAM, using a dynamically changing training clock. The methods comprise receiving a system clock having a clock signal at a first pulse rate. Then, during the training of the interface, the methods further comprise generating a training clock from the clock signal at the first pulse rate, the training clock having a clock signal at a second pulse rate, and sending, based on the generated training clock, command signals, including address data, to the DRAM.

Figure 1:
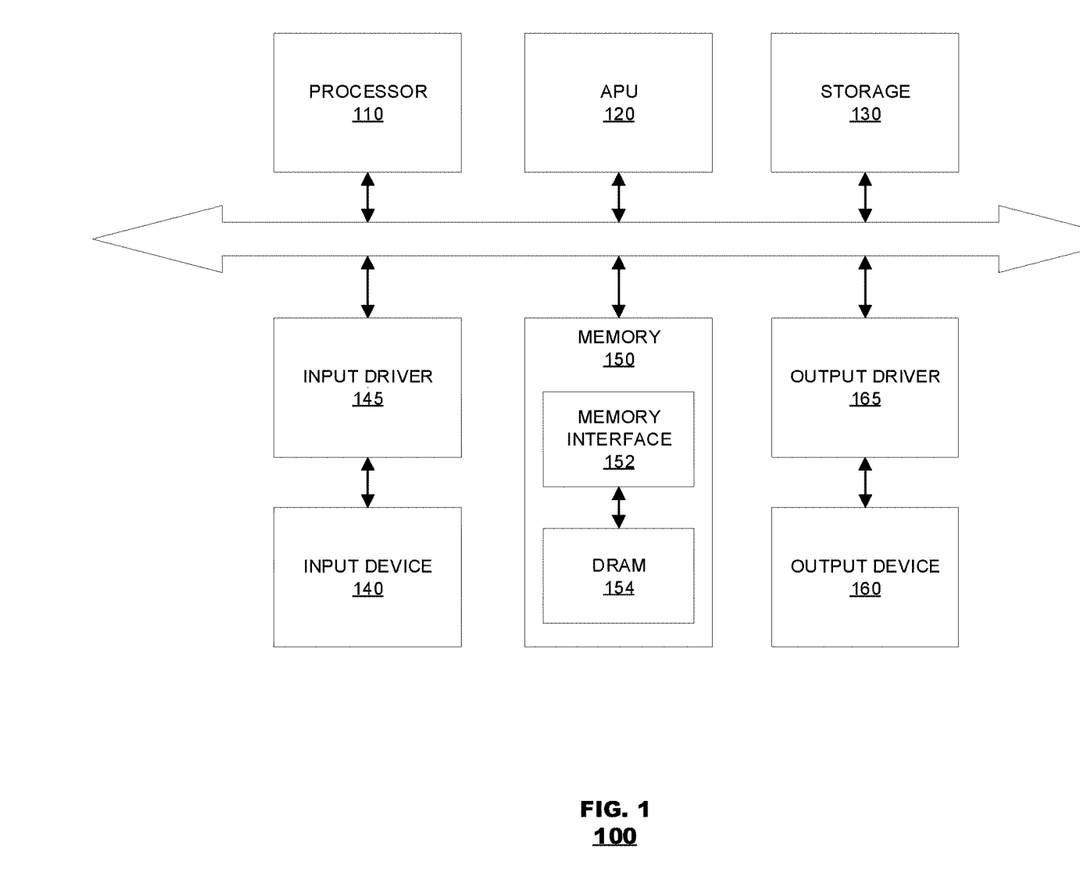
FIG. 1 is a block diagram of an example device, based on which one or more features of the disclosure can be implemented.

FIG. 1 is a block diagram of an example device 100, based on which one or more features of the disclosure can be implemented. The device 100 can be, for example, a computer, a gaming device, a handheld device, a set-top box, a television, a mobile phone, or a tablet computer. The device 100 can include a processor 110, an accelerated processing unit (APU) 120, storage 130, an input device 140, memory 150, and an output device 160. The device 100 can also include an input driver 145 and an output driver 165. The processor 110 and the APU 120 can represent one or more cores of central processing units (CPUs) and one or more cores of APUs, respectively. The processor 110, the APU 120, and the memory 150, or a subset thereof, may be located on the same die or on separate dies. In an aspect, the device 100 can include additional components not shown in FIG. 1.

The APU 120 can represent a graphics processing unit (GPU), that is, a shader system comprising one or more parallel processing units that are configured to perform computations, for example, in accordance with a single instruction multiple data (SIMD) paradigm. The APU 120 can be configured to accept compute commands and graphics rendering commands from the processor 110, to process those compute and graphics rendering commands, and/or to provide output to a display (the output device 160).

The storage 130 can include fixed or removable storage, for example, a hard disk drive, a solid-state drive, an optical disk, or a flash drive. The input device 140 can represent, for example, a keyboard, a keypad, a touch screen, a touch pad, a detector, a microphone, an accelerometer, a gyroscope, a biometric scanner, or a network connection (e.g., a wireless local area network card for receipt of wireless IEEE 802 signals). The output device 160 can represent, for example, a display, a speaker, a printer, a haptic feedback device, one or more lights, an antenna, or a network connection (e.g., a wireless local area network card for transmission of wireless IEEE 802 signals). In an aspect, the input driver 145 communicates with the processor 110 (or the APU 120) and the input device 140, and facilitates the receiving of input from the input device 140 to the processor 110 (or the APU 120). In another aspect, the output driver 165 communicates with the processor 110 (or the APU 120) and the output device 160, and facilitates the sending of output from the processor 110 (or the APU 120) to the output device 160.

The memory 150 can represent volatile or non-volatile memory, including random-access memory (RAM), static random-access memory (SRAM), dynamic random-access (DRAM), a cache, or a combination thereof. The memory 150 comprises a memory interface 152 that can facilitate access by the system components (e.g., the processor 110 or the APU 120) to DRAM 154. The memory interface 152 carries out operations, such as reading from, writing to, refreshing, and configuring the DRAM 154. The memory interface 152 also performs training based on which operational parameters of internal and external datapaths are set, as described herein.

Figure 2:
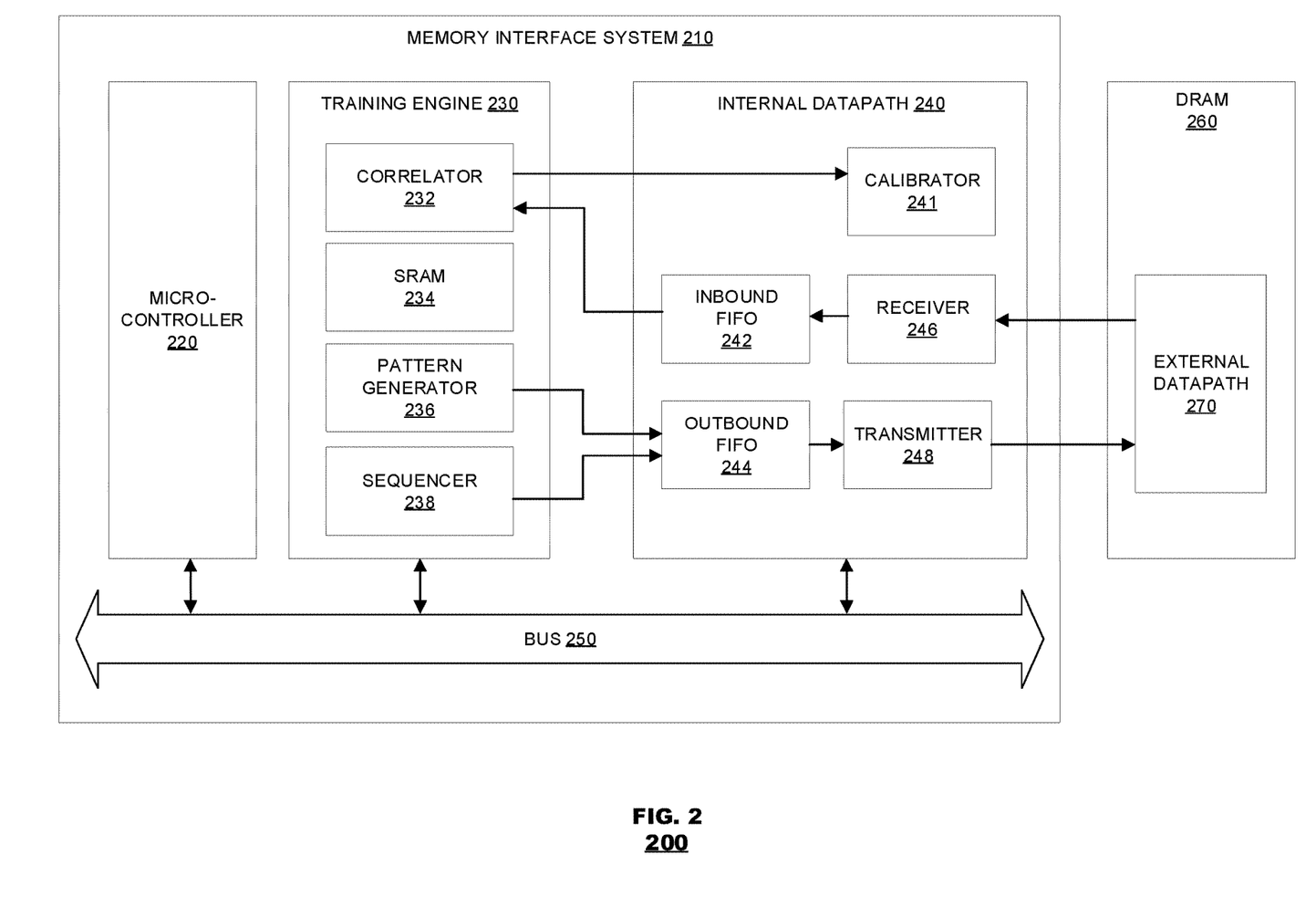
FIG. 2 is a block diagram of an example memory interface system, employable by the device of FIG. 1, based on which one or more features of the disclosure can be implemented.

FIG. 2 is a block diagram of an example memory system 200, employable by the device of FIG. 1, based on which one or more features of the disclosure can be implemented. The system 200 includes a memory interface system 210 (e.g., the memory interface 152 shown in FIG. 1), configured to access the DRAM 260 (e.g., the DRAM 154 shown in FIG. 1). The DRAM 260 can represent various DRAM technologies, such as DDR4-6, LPDDR4-6, GDDR7, or HBM3. The memory interface system 210 includes a microcontroller 220, a training engine 230, and an internal datapath 240. The microcontroller 220, the training engine 230, and the internal datapath 240 are communicatively connected, directly and/or via the system's 210 internal bus 250. The system's 210 functions, as described herein, may be implemented by components of the microcontroller 220, the training engine 230, and the internal datapath 240, in hardware, firmware, software, or a combination thereof.

The microcontroller 220 is configured to initiate training operations, carried out by the training engine 230. The microcontroller 220 may initiate training operations and/or set the system's 210 state registers in response to signals sent by the host 100 (e.g., the processor 110 or the APU 120) or events, such as power up, clock frequency changes, power state transitions (e.g., between idle and active states), or, periodically, at a predetermined frequency.

The internal datapath 240 includes a calibrator 241, an inbound first-in-first-out (FIFO) stack 242 coupled to a receiver 246, and an outbound FIFO stack 244 coupled to a transmitter 248. The receiver 246 converts analog signals measured from the DRAM's 260 pins into discrete data that are then pushed into the inbound FIFO stack 242. The transmitter 248 converts discrete data popped out from the outbound FIFO 244 into analog signals that are fed into the DRAM's 260 pins. The operations of the internal datapath 240—including the receiver 246 circuitry (that employs analog-to-digital conversions) and the transmitter 248 circuitry (that employs digital-to-analog conversions)—can be controlled and tuned by various configuration registers (i.e., CSRs). Similarly, the DRAM includes a corresponding datapath (referred to herein as the external datapath) 270 that includes, for example, a receiver and a transmitter, that receive signals from and transmit signals to the transmitter 248 and the receiver 246, respectively, and that can be controlled and tuned by various configuration registers of the DRAM. During the training operation, carried out by the training engine 230, configuration registers of both the internal datapath 240 and the external datapath 270 are set (or calibrated), as disclosed herein.

The training engine 230 comprises components that carry out the training of the datapaths 240, 270, including a sequencer 238, a pattern generator 236, SRAM 234, and a correlator 232. The training engine 230, as disclosed herein, can perform various programable functionalities.

The sequencer 238 can be programmed to generate a sequence of commands employed in the training of the interface with DRAM 260 of various technologies (e.g., having different interface protocols). The training of a memory interface involves adjustments made to operational parameters that control circuitry in the datapaths 240, 270, that is, calibration of their configuration registers. The calibration of the configuration registers of the internal datapath 240 is carried out by CSR commands, and the calibration of the configuration registers of the external datapath 270 is carried out by DRAM commands. The calibration of these configuration registers is done in an iterative process (i.e., training) in which, for example, the disparity between data patterns that are read from the DRAM and reference data patterns is minimized. To perform a training operation, the sequencer 238 generates a training command sequence, including DRAM commands interleaved with system commands. The sequencer 238 then executes the training command sequence and coordinates the training operation, sending signals to other system components, such as the correlator 232 and the pattern generator 236, to perform their respective functions.

The pattern generator 236 is configured to generate data patterns to be used as reference data patterns by the training operation. For example, a training operation may be employed that calibrates configuration registers that control the writing into a DRAM 260. In this case, a command sequence, generated by the sequencer 238, may include commands to write a data pattern, generated by the pattern generator 236, into specified locations in the DRAM 260 and commands to read back the written data pattern from the specified locations in the DRAM 260. Then, the read data pattern can be compared with the written data pattern, and, based on this comparison, error statistics may be determined. The determined error statistics can then be used to calibrate the configuration registers—that is, to tune the control variables of the datapaths 240, 270 through which the written data pattern is transmitted, as discussed in detail below.

The SRAM 234 may be used to store training sequences or data patterns that, for example, were previously generated by the sequencer 238 or the pattern generator 236, respectively. Stored training sequences and data patterns may be used when the system 100 is booting up or for periodic training. Having such training sequences and data patterns already resident in the SRAM 234 allows for faster (boot or periodic) training times.

The correlator 232 is configured to access reference data patterns (e.g., generated by the pattern generator 236 and/or stored in the SRAM 234) and to compare these reference data patterns with corresponding data patterns that are read from the DRAM 260. For example, when the training is with respect to a writing operation, a reference data pattern may be a data pattern that was written to a location in the DRAM 260 and then read back from that location. In such a case, for example, the sequencer 238 may signal the pattern generator 236 to generate a reference data pattern (or to load a reference data pattern already generated and/or stored in the SRAM 234). The sequencer 238 may then encode commands that facilitate writing the reference data pattern into a location in the DRAM 260. The sequencer 238 may also encode commands that facilitate reading back the written data pattern from the DRAM 260. These DRAM commands and the data that are written are transmitted to the DRAM 260 via the outbound FIFO stack 244 and the transmitter 248. The data that are read are received via the receiver 246 and the inbound FIFO stack 242. Following the reading operation, the sequencer 238 may signal the correlator 232 to perform a comparison between the reference data pattern and the corresponding read data pattern. Based on the comparison, the correlator 232 can determine error statistics. The error statistics can be used to adjust operational parameters stored in respective configuration registers of the datapaths 240, 270.

During training, the sequencer 238 may iterate through a command sequence (e.g., including writing and/or reading operations), where each iteration can result in further adjustment of an operational parameter and convergence toward an optimal result (with favorable error statistics). However, if convergence is not achieved, error statistics across iterations can be collected and further analysis may be done to reach an optimal result for the operational parameter. In an aspect, to calibrate an operational parameter that is stored in a control register of the internal datapath 240, the correlator 232 may feed the calibrator 241 data associated with error statistics derived from one or more iterations through the command sequence. Based on those data, the calibrator 241 can adjust the operational parameters. To calibrate an operational parameter that is stored in a control register of the external datapath 270, the calibrator can signal the sequencer 238 with the adjustment value. In response, the sequencer 238 can send a DRAM command that accordingly adjusts the respective control register in the DRAM (e.g., Mode Register Write or Mode Register Read commands). In another aspect, the calibrator 241 may determine the quality of a signal measured from a DRAM pin during each iteration and use these measurements to adjust an operational parameter of either the internal or external datapaths 240, 270. As mentioned above, data associated with error statistics and/or the quality of a signal may be collected across several training iterations and may be used by the system 210 for further analysis, based on which an optimal result for an operational parameter may be computed in case the iterative adjustments of the operational parameter do not converge.

The operation of the sequencer 238, including the generation and the execution of training sequences used to calibrate the data channels of the DRAM, is further described in U.S. patent application Ser. No. 17/564,327, filed Dec. 29, 2021, titled "DRAM specific interface calibration via programmable training sequences." However, the calibration of the data channels relies on properly calibrated address channels. Techniques to calibrate the address channels of the DRAM are described below.

Figure 3:
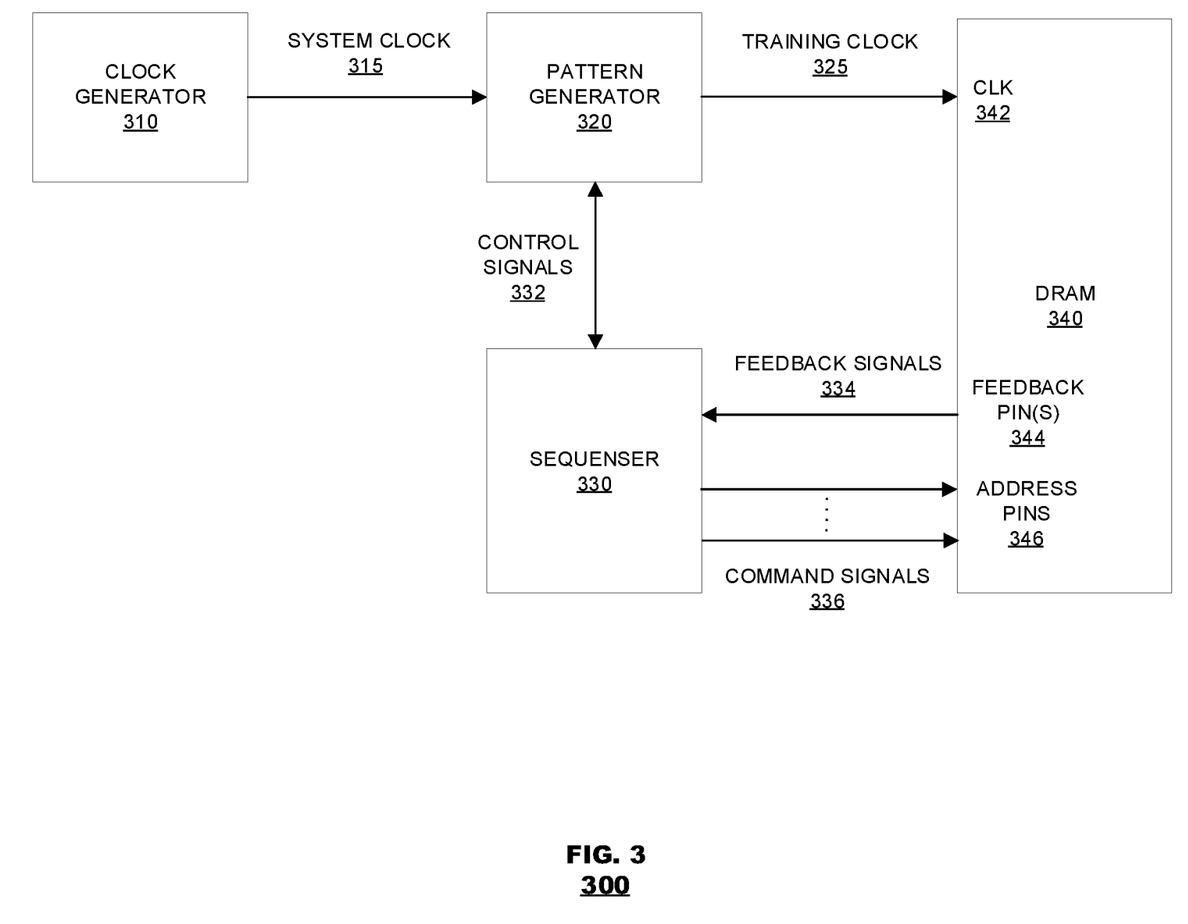
FIG. 3 is a functional block diagram of an example system for calibrating an interface with DRAM using a dynamically changing training clock, based on which one or more features of the disclosure can be implemented.

FIG. 3 is a functional block diagram of an example system 300 for calibrating an interface with DRAM using a dynamically changing training clock, based on which one or more features of the disclosure can be implemented. The system 300 includes a clock generator 310, a pattern generator 320 (e.g., the pattern generator 236 of FIG. 2), a sequencer 330 (e.g., the sequencer 238 of FIG. 2), and DRAM 340 (e.g., the DRAM 260 of FIG. 2). The functionality described herein with respect to the components 310, 320, 330 of the system 300 can be implemented in software, hardware, and/or firmware by different components of the memory interface system 210, described herein in reference to FIG. 2. In an aspect, the clock generator 310 generates a pulse signal at a maximum rate, namely the system clock 315. The system clock 315 is fed into the pattern generator 320. Based on control signals 332 received from the sequencer 330 (or from other components of the memory interface system 210), the pattern generator 320 generates a pulse pattern, that is, the training clock 325. The training clock 325 is fed to the clock input 342 of the DRAM 340. The sequencer 330, as described above, orchestrates the training of the DRAM at a training frequency set by the training clock 325. Thus, the sequencer 330 is configured to generate DRAM command sequences with which training of the interface to the DRAM is conducted and based on which the datapaths 240, 270 to and from the DRAM are calibrated. The sequencer 330 is further configured to dynamically change the clock frequency in which the interface to the DRAM is trained. To that end, the sequencer 330 can signal the pattern generator 320 to produce, out of the system clock 315, a pulse pattern at a desired pulse rate, effectively slowing the pulse rate of the system clock 315 by, for example, a 1:2, 1:4, or 1:32 ratio. The sequencer 330 is configured to send command signals 336, including address data, and to receive feedback signals 334 based on which the address channels of the DRAM 340 are calibrated, as described in detail below.

In an aspect, the sequencer 330 is configured to schedule commands in a dynamically changing granularity. The memory interface system 210 is configured to operate in a fixed clock frequency 315 that is above the maximum clock frequency of the DRAM 340. Typically, DRAM can operate in a range between 50 MHz to 5,000 MHz. To be able to train the DRAM at different frequencies of operation, the sequencer 330 is configured to dynamically alter the training clock 325 and the rate at which commands are sent to the DRAM. To that end, the sequencer 330, via the pattern generator 320, can generate a pulse pattern with a desired pulse rate, that is, the training clock 325 with which the DRAM is trained. Further, commands generated by the sequencer consist each of command states that are valid during one clock cycle of the system clock 315. Since commands sent to the DRAM 336 must each consist of command states that are valid during one DRAM clock cycle 342, the sequencer advances the state of its generated commands so that each command consists of command states that are valid during one clock cycle of the training clock. Advancing a command state involves maintaining the same state for several system clock 315 cycles (generating the same command state for multiple system clock cycles) so that the produced command is at a rate that matches the training clock pulse rate 325.

Hence, the sequencer 330 advances command states based on the training clock pulse rate 325. For example, when training an LPDDR5 to operate in a 2:1 mode of operation, instead of sending a new command state every clock cycle, the sequencer 330 may repeat the same command state twice, that is, sending a new command state every two clock cycles 315. Similarly, when training the LPDDR5 to operate in a 4:1 mode of operation, instead of sending a new command state every clock cycle, the sequencer 330 repeats the same command state four times, that is, sending a new command state every four clock cycles. In an aspect, generating pulse patterns out of the system clock 315 at different pulse rates 325 can be done programmatically during the training operation by, for example, setting the control registers of the pattern generator circuitry 320.

In addition to training the DRAM at different operating clock frequencies, dynamically changing the training clock 325 frequency is instrumental in calibrating the address channels of the DRAM. Generally, a calibration of the address channels should precede the calibration of the data channels described above. A calibration of the address channels is performed to compensate for differences in the propagation times of signals sent to the different DRAM's address pins 346. That is, variations in the physical properties of the wires (e.g., manufacturing and length variations) that connect the source of the command signals 336 (e.g., pins of the memory interface system 210) with corresponding address pins 346, cause different delays in the reception of address data at the address pins. These different delays cause corresponding elements of the address data to be received during different clock cycles of the DRAM. As disclosed herein, calibrating the address channels of the DRAM 340 involves measuring these delays and aligning corresponding address data elements based on the measured delays.

Figure 4:
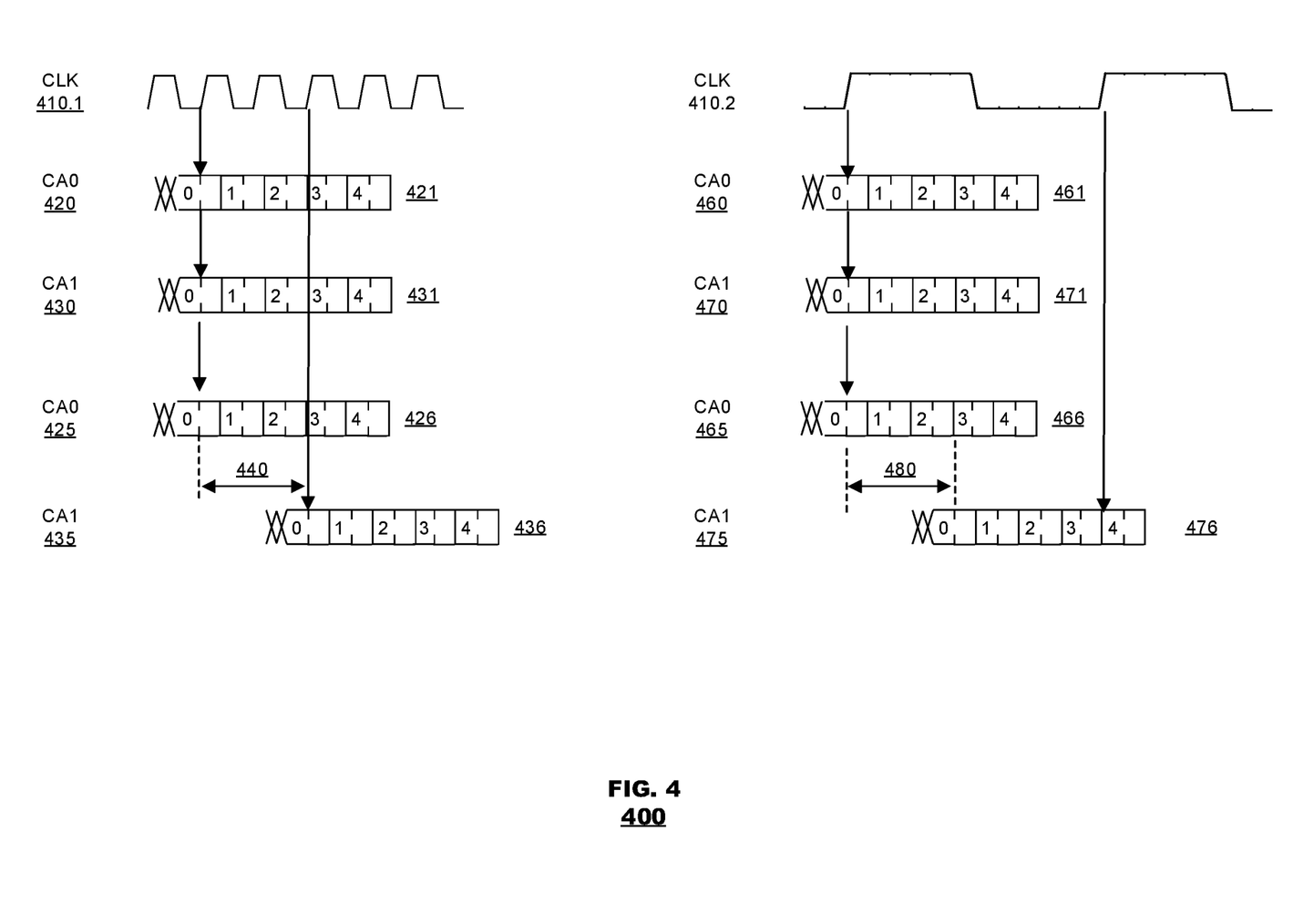
FIG. 4 is a diagram, illustrating delays in address data being received at respective address pins of the DRAM, based on which one or more features of the disclosure can be implemented.

FIG. 4 is a diagram, illustrating delays in address data received at different address pins of the DRAM, based on which one or more features of the disclosure can be implemented. As shown in FIG. 4, a part of the command signal 336 that corresponds to address data reaches address pin CA0 and address pin CA1 Corresponding elements of the sent address data are denoted in FIG. 4 by the same element number (e.g., 0, 1, 2, 3, and 4). As mentioned above, due to differences in the propagation times along the wires that connect the source of the sent address data and the respective address pins, corresponding data elements from the address data are delayed relative to each other when they reach the respective address pins. One way to measure these delays is based on feedback data 334. One or more feedback pins are usually available in DRAM that can be used to capture address data sent to the DRAM. For example, DDR5-RDIMM has an "ALERT" feedback pin available, allowing for sequential training of the address pins. Likewise, LPDDR5 has multiple "DQ" feedback pins available, allowing for parallel training of the address pins.

To measure the propagation time delay with respect to an address pin (e.g., CA0 or CA1), the sequencer 330 sends address data to the address pin and measures the time delay at which the address data is received via the feedback channel 334. For example, the sequencer 330 may send address data to address pin CA0 420, 425 and read back the sent address data 421, 426 via a feedback channel. Each data element of these address data is then read at a rise of a clock pulse 410.1. Similarly, the sequencer 330 may send address data to address pin CA1 430, 435 and read back the sent address data 431, 436 via a feedback channel. Each data element of these address data is also read at a rise of a clock pulse 410.1. As shown, in a first case, signals sent through the respective wires of CA0 420 and CA1 430 have the same propagation times, and so the address data (421 and 431) these signals contain are aligned—at the pulse rise of the clock 410.1 the same corresponding address data elements can be read. In a second case, signals sent through the respective wires of CA0 425 and CA1 435 have different propagation times, and so the address data (426 and 436) these signals contain are not aligned. However, because the difference in propagation times is larger than one clock cycle, at the pulse rise of the clock 410.1 the same corresponding address data elements can still be read and the delay 440 is not detectable.

To be able to detect such a delay, the clock cycle should be larger than the maximum expected delay, as demonstrated in FIG. 4 with respect to clock signal 410.2. As shown, in the first case, signals sent through the respective wires of CA0 460 and CA1 470 have the same propagation times, and so these signals contain address data (461 and 471) that are aligned—at the pulse rise of the clock 410.2 the same corresponding address data elements can be read. In the second case, signals sent through respective wires of CA0 465 and CA1 475 have different propagation times, and so these signals contain address data (466 and 476) that are not aligned. However, in this case, the delay 480 is detectable as, this time, reading the address data (466 and 476) at the pulse rises of the clock 410.2 will indicate that the address data, 466 and 476, that read, respectively, from CA0 465 and CA1 475 are not aligned. The maximum expected delay that can be caused by a propagation time along a wire can be estimated (e.g., based on experimentations) to be within a range, namely a delay range. Based on this delay range, a clock cycle can be produced that is larger than that range. Thus, during a calibration of the address pins, the sequencer 330 can set the pattern generator 320 to generate a pulse pattern (training clock 325) with a clock cycle that is larger than the delay range.

Figure 5:
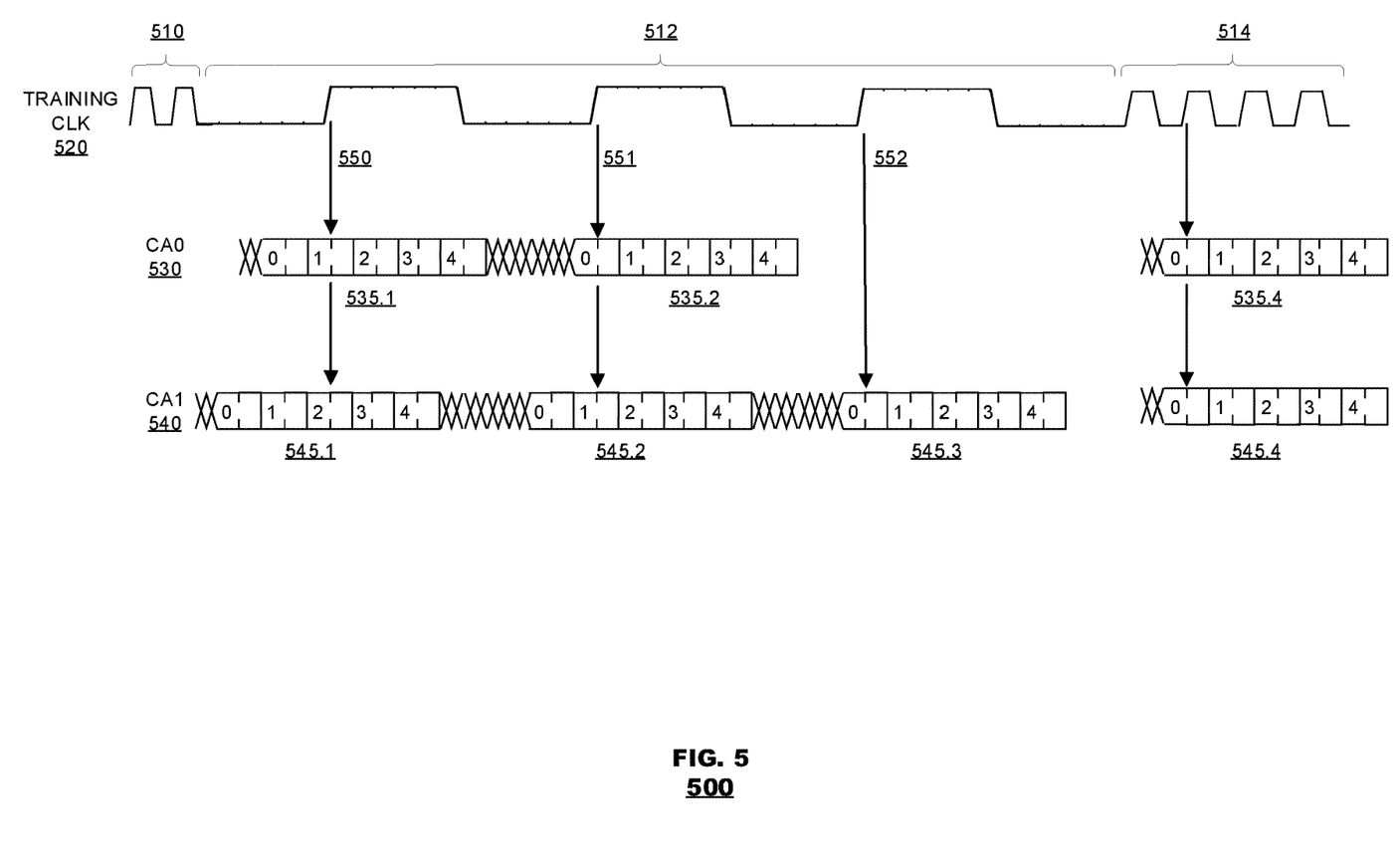
FIG. 5 is a diagram, illustrating the alignment of address data being received at respective address pins of the DRAM, based on which one or more features of the disclosure can be implemented.

FIG. 5 is a diagram, illustrating the alignment of address data received at respective address pins of the DRAM, based on which one or more features of the disclosure can be implemented. As described above the training clock's 325, 520 pulse rate, at which training of the interface to the DRAM is performed, can be changed dynamically during the training. As explained with reference to FIG. 4, when training the address pins of the DRAM the training clock's 325 pulse rate should be reduced to generate a clock cycle that is above the expected delay range. Accordingly, during training, the pattern generator 320 can generate a pulse pattern that produces a training clock pulse 325, 520 at the maximum data rate 510 of the system clock 315. Then, when address training begins, the pattern generator 320 can generate a pulse pattern (of the training clock 325, 520) at a reduced data rate 512 relative to the system clock 315. At the conclusion of the address training, the pattern generator can go back to generating a pulse pattern 325, 520 at the maximum data rate 514 of the system clock 315. During the time in which the training clock's data rate is reduced 512, the sequencer 330 is employed to determine the delays that should be introduced to the transmissions of respective address data in order to align them as they reach respective address pins, as further explained below.

During the training of address pin CA0 530, the sequencer 330 sends address data 535 and reads back the sent data via a feedback pin (e.g., DQ0 pin of LPDDR5) at the rise of the training clock 520. For example, when the sequencer sends address data to CA0 530, it may read back the second element of the address data 535.1 at a pulse rise 550. Based on that reading, the sequencer introduces a delay, associated with CA0 530, to a following transmission of the address data to CA0 530. As a result, in a following pulse rise 551, the sequencer may read the first element of the data address 335.2. At this point, the sequencer stores the introduced delay associated with CA0. During the training of address pin CA1 540, the sequencer 330 sends address data 545 and reads back the sent data via a feedback pin (e.g., DQ1 pin of LPDDR5) at the rise of the training clock 520. For example, when the sequencer sends address data to CA1 540, it may read back the third element of the address data 545.1 at the pulse rise 550. Based on that reading, the sequencer introduces a delay, associated with CA1 540, to a following transmission of the address data to CA1 540. As a result, in a following pulse rise 551, the sequencer may read the second element of the data address 545.2. Based on that reading, the sequencer introduces a further delay, associated with CA1 540, to a following transmission of the address data to CA1 540. As a result, in a following pulse rise 552, the sequencer may read the first element of the data address 545.3. At this point, the sequencer stores the introduced further delay associated with CAL In this manner, the sequencer can determine the delays associated with all respective address pins, so that when the determined delays are applied to following transmissions of address data, the address data are aligned when reaching respective address pins. Hence, at the conclusion of the training of the address channels, when the training clock is set back to a higher rate 514 (e.g., the maximum rate of the system clock 315) to train other datapaths of the interface to the DRAM, the stored delays associated with CA0 530 and CA1 540 are introduced to the transmissions of address data, so that the sent address data 535.4 and 545.4 are aligned when reaching their respective address pins 530 and 540. Since a signal propagation time depends on the signal's frequency, prior to training the other datapaths, the delays associated with the address pins can be fine-tuned at the higher rate 514 of the training clock.

Figure 6:
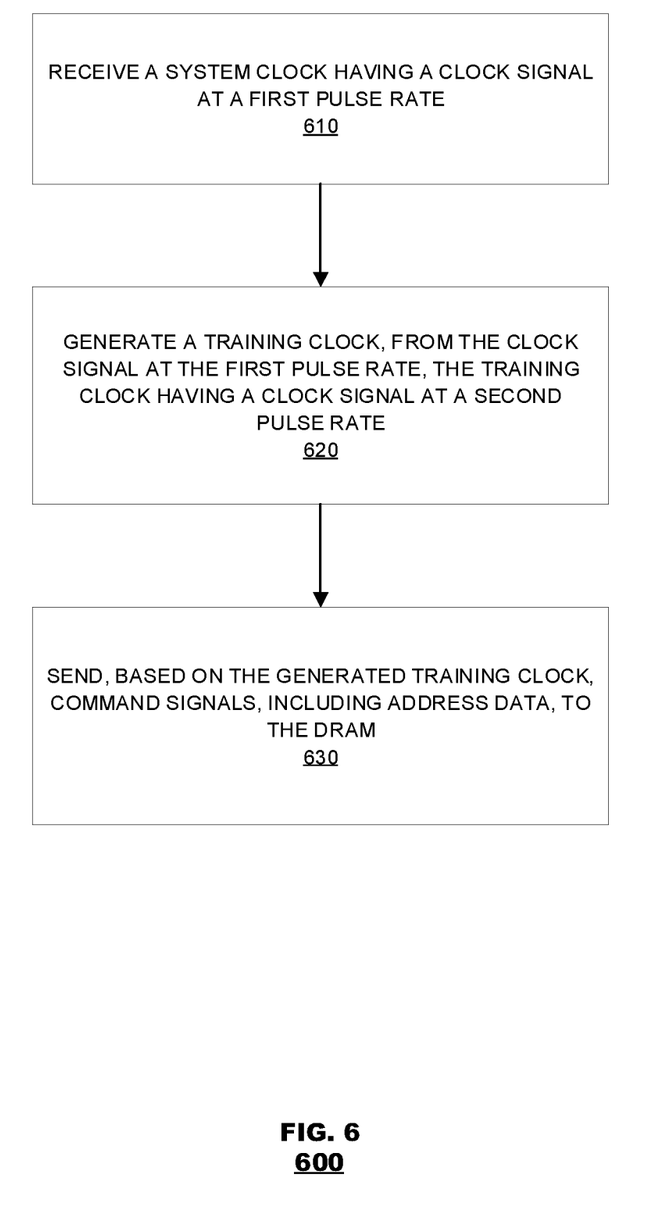
FIG. 6 is a flowchart of an example method for calibrating an interface with DRAM using a dynamically changing training clock, based on which one or more features of the disclosure can be implemented.

FIG. 6 is a flowchart of an example method 600 for calibrating an interface with DRAM using a dynamically changing training clock, based on which one or more features of the disclosure can be implemented. The method 600 begins with step 610, where a system clock having a clock signal at a first pulse rate is received. Then, during the training of the interface with the DRAM, as disclosed herein, a training clock is generated from the clock signal at the first pulse rate, in step 620. The training clock has a clock signal at a second pulse rate. In an aspect, the second pulse rate can be determined based on a delay range associated with propagation times of signals across the wires that connect address pins of the DRAM 260 and corresponding pins in the memory interface system 210. In step 630, command signals, including address data, are sent to the DRAM based on the generated training clock. In an aspect, the sent command signals are generated at the second pulse rate by, for example, repeating command states of command signals that were generated at the first pulse rate. In another aspect, the method 600 includes determining propagation delays associated with address data that are sent to respective address pins 346 of the DRAM 340. A propagation delay can be determined based on a reading of a feedback signal 334 that captures the address data sent to a respective address pin. Then, based on the determined propagation delays, address data can be aligned in further transmissions of address data to respective address pins. Further, during the training of the interface, method 600 can generate a training clock from the system clock with a clock signal at a third pulse rate. And, then, train other datapaths of the DRAM by sending data to the data channels of the DRAM based on the generated training clock at the third pulse rate.

It should be understood that many variations are possible based on the disclosure herein. Although features and elements are described above in particular combinations, each feature or element can be used alone without the other features and elements or in various combinations with or without other features and elements.

The methods provided can be implemented in a general-purpose computer, a processor, or a processor core. Suitable processors include, by way of example, a general-purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such as instructions capable of being stored on a computer readable media). The results of such processing can be maskworks that are then used in semiconductor manufacturing processes to manufacture processors that implement aspects of the embodiments.

The methods or flow charts provided herein can be implemented in a computer program, software, or firmware incorporated in a non-transitory computer-readable storage medium for execution by a general-purpose computer or processor. Examples of non-transitory computer-readable storage (medium) include read only memory (ROM), random-access memory (RAM), a register, cache memory, semiconductor memory devices, magnetic media such as internal hard drive and disks and removable disks, magneto-optical media, and optical media such as CD-ROM disks, and digital versatile disks (DVDs).

What is claimed is:

1. A method for calibrating, by a memory interface system, an interface with dynamic random-access memory (DRAM), comprising:
   receiving a system clock having a first clock signal at a first pulse rate; and
   during the calibrating of the interface,
      generating a training clock from the first clock signal at the first pulse rate, the training clock having a second clock signal at a second pulse rate, and
      sending, based on the generated training clock, command signals, including address data, to the DRAM at the second pulse rate.

2. The method of claim 1, wherein the second pulse rate matches an altered clock frequency of the DRAM.

3. The method of claim 1, further comprising,
   generating the command signals at the second pulse rate by repeating command states of corresponding command signals that are generated at the first pulse rate.

4. The method of claim 1, wherein,
   the second pulse rate is determined based on a delay range associated with propagation times of signals transmitted across wires that connect address pins of the DRAM and corresponding pins in the system.

5. The method of claim 1, further comprising,
   determining propagation delays associated with the address data sent to respective address pins of the DRAM.

6. The method of claim 5, wherein one of the propagation delays is determined based on a reading of a feedback signal that captures the address data sent to a respective address pin using the training clock at the second pulse rate.

7. The method of claim 5, further comprising
aligning, based on the determined propagation delays, address data that are further sent to the respective address pins.

8. The method of claim 1, further comprising
during the training of the interface,
generating a training clock, from the first clock signal at the first pulse rate, having a third clock signal at a third pulse rate, and
sending, based on the generated training clock, data to the DRAM.

9. A memory interface system for calibrating an interface with DRAM, using a dynamically changing training clock, comprising:
at least one processor; and
memory storing instructions that, when executed by the at least one processor, cause the processor to:
receive a system clock having a first clock signal at a first pulse rate, and
during the calibrating of the interface,
generate a training clock from the first clock signal at the first pulse rate, the training clock having a second clock signal at a second pulse rate, and
send, based on the generated training clock, command signals, including address data, to the DRAM at the second pulse rate.

10. The system of claim 9, wherein the second pulse rate matches an altered clock frequency of the DRAM.

11. The system of claim 9, wherein the instructions further cause the processor to,
generate the command signals at the second pulse rate by repeating command states of corresponding command signals that are generated at the first pulse rate.

12. The system of claim 9, wherein,
the second pulse rate is determined based on a delay range associated with propagation times of signals transmitted across wires that connect address pins of the DRAM and corresponding pins in the system.

13. The system of claim 9, wherein the instructions further cause the processor to,
determine propagation delays associated with the address data sent to respective address pins of the DRAM, wherein one of the propagation delays is determined based on a reading of a feedback signal that captures the address data sent to a respective address pin using the training clock at the second pulse rate.

14. The system of claim 13, wherein the instructions further cause the processor to,
align, based on the determined propagation delays, address data that are further sent to the respective address pins.

15. A non-transitory computer-readable medium comprising instructions executable by at least one processor to perform a method for calibrating an interface with DRAM, the method comprising:
receiving a system clock having a clock signal at a first pulse rate; and
during the calibrating of the interface,
generating a training clock from the first clock signal at the first pulse rate, the training clock having a second clock signal at a second pulse rate, and
sending, based on the generated training clock, command signals, including address data, to the DRAM at the second pulse rate.

16. The medium of claim 15, wherein the second pulse rate matches an altered clock frequency of the DRAM.

17. The medium of claim 15, further comprising,
generating the command signals at the second pulse rate by repeating command states of corresponding command signals that are generated at the first pulse rate.

18. The medium of claim 15, wherein,
the second pulse rate is determined based on a delay range associated with propagation times of signals transmitted across wires that connect address pins of the DRAM and corresponding pins in the system.

19. The medium of claim 15, further comprising,
determining propagation delays associated with the address data sent to respective address pins of the DRAM, wherein one of the propagation delays is determined based on a reading of a feedback signal that captures the address data sent to a respective address pin using the training clock at the second pulse rate.

20. The medium of claim 19, further comprising
aligning, based on the determined propagation delays, address data that are further sent to the respective address pins.

* * * * *